United States Patent
Yotsuyanagi

Patent Number: 5,424,681
Date of Patent: Jun. 13, 1995

[54] WIDE RANGE OPERATIONAL AMPLIFIER
[75] Inventor: Michio Yotsuyanagi, Tokyo, Japan
[73] Assignee: NEC Corporation, Tokyo, Japan
[21] Appl. No.: 272,262
[22] Filed: Jul. 8, 1994
[30] Foreign Application Priority Data Jul. 13, 1993 [JP] Japan .................................. 5-173031

[51] Int. Cl.[6] .............................................. H03F 3/45
[52] U.S. Cl. ...................................... 330/253; 330/257
[58] Field of Search ................. 330/252, 253, 257, 261

[56] References Cited

U.S. PATENT DOCUMENTS 5,146,179  9/1992  Carley et al. ..................... 330/253
5,168,243 12/1992  Feliz et al. ......................... 330/252

OTHER PUBLICATIONS

Ribner, David "Design Techniques for Cascoded CMOS Op Amps with Improved PSRR and Common-Mode Input Range" *IEEE Journal of Solid State Circuits*, vol. SC-19, No. 6, Dec. 1984.

Primary Examiner—Steven Mottola

[57] ABSTRACT

An operational amplifier includes a transistor differential pair having a common source terminal which is coupled to a first power supply terminal through a first current source circuit. A first transistor is provided which has a gate coupled to a first input terminal of the transistor differential pair, a source coupled to a first output of the transistor differential pair, and a drain coupled to a first output terminal. A second current source circuit is coupled between the first power supply terminal and the drain of the first transistor. A second transistor has a gate coupled to a second input terminal of the transistor differential pair, a source coupled to a second output of the transistor differential pair, and a drain coupled to a second output terminal. A third current source circuit is coupled between the first power supply terminal and the drain of the second transistor. A fourth current source circuit is coupled between the source of the first transistor and the second power supply terminal. A fifth current source circuit is coupled between the source of the second transistor and the second power supply terminal. The input signals of the transistor pair are applied to the gates of the source-input transistors connected to the transistor differential pair.

7 Claims, 6 Drawing Sheets

WIDE RANGE OPERATIONAL AMPLIFIER

BACKGROUND OF THE INVENTION

1. Field of the Invention

The present invention relates to a wide range operational amplifier using transistors.

2. Related Art

An operational amplifier circuit (OP amp) as shown in FIG. 1 which is called a folded cascaded circuit has been known as a wide range operational amplifier. Such folded cascaded circuit is described in "Design Techniques for Cascaded CMOS OP Amps with improved PSPR and Common-mode input range", for example.

The OP amp shown in FIG. 1 includes first and second power supply terminals 1, 2; input terminals 4, 5; output terminals 6, 7; first, second and third current source circuits I1, I2, and I3 connected to the first power supply terminal 1; a transistor differential pair 3, a common source terminal of which is connected to the first power supply terminal 1 through the first current source circuit I1; a first transistor M1, a gate B1 of which is biased to a constant voltage, a source of which is connected to a first output 8 of the transistor differential pair 3, and a drain of which is connected to the first output terminal 6; a second transistor M2, a gate B2 of which is biased to a constant voltage, a source of which is connected to a second output 9 of the transistor differential pair 3, and a drain of which is connected to the second output terminal 7; a fourth current source circuit I4 connected between the source of the first transistor M1 and the second power supply terminal 2; and a fifth current source circuit I5 connected between the source of the second transistor M2 and the second power supply terminal 2.

A signal input to an input terminal 4 of the operational amplifier is inverted by a differential input stage, amplified by the transistor M1, and is then output from the output terminal 6. Similarly, a signal input to an input terminal 5 of the transistor differential pair 3 is inverted by the differential input stage, amplified by the transistor M2, and is then output from the output terminal 7. Accordingly, this OP amp inputs a differential input signal, inverts and amplifies the same, and outputs a differential output signal.

An example of a frequency characteristic of gain and phase of such operational amplifier (hereinafter referred to as frequency characteristic) is shown in FIG. 2.

According to this circuit, the frequency characteristic is degraded due to the poles and the zero point caused by the load capacitance and the gate-grounded type transistors M1 and M2.

When the load capacitance connected to the output terminal becomes smaller, the frequency at unity gain (at 0 dB) (hereinafter referred to as unity gain frequency) becomes larger. The phase margin, however, becomes smaller. In the example shown in FIG. 2, as the load capacitance becomes smaller such as 10 pF, 5 pF, 1 pF, 0.5 pF, and 0.1 pF, the unity gain frequency is increased such as 7 MHz, 14 MHz, 45 MHz, 60 MHz, and 79 MHz. However, the phase margin becomes smaller such as 85 degrees, 79 degrees, 56 degrees, 46 degrees, and 34 degrees.

The phase margin is preferably at least 45 degrees and if possible 60 degrees to ensure that the OF amp will operate stably at the unity gain frequency. If the phase margin is smaller than 45 degrees, the OP amp cannot operate stably at the unity gain frequency.

For this reason, if the phase margin becomes smaller as described above, the operational amplifier cannot operate stably. For example, if the phase margin is 46 degrees or less, the OP amp is subject to oscillation. Accordingly, when the conventional operational amplifier is used in an application where the load capacitance is varied, its operation condition is constrained. Further, the stable operation cannot be guaranteed without an optimal design tailored to the load capacitance.

SUMMARY OF THE INVENTION

The present invention has been intended to avoid above drawbacks. It is an object of the present invention to provide an amplifier whose phase margin is not changed and which can operate stably even if the load capacitance is changed.

According to a first aspect of the present invention, an operational amplifier comprises:
  first and second power supply terminals
  first and second input terminals
  first and second output terminals
  first, second, and third current source circuits connected to the first power supply terminal;
  a transistor differential pair connected to the first and second input terminals and coupled to the first power supply terminal through the first current source circuit;
  a first transistor a control terminal of which is coupled to the first input terminal, one terminal of a current path of which is coupled to a first output of the transistor differential pair, and the other terminal of the current path of which is coupled to the first output terminal and the first power source terminal 1 through the second current source circuit;
  a second transistor, a control terminal of which is coupled to the second input terminal, one terminal of a current path of which is coupled to a second output of the transistor differential pair, and the other terminal of the current path of which is coupled to the second output terminal and the first power source terminal 1 through the third current source circuit;
  a fourth current source circuit coupled between the one terminal of the current path of the first transistor and the second power supply terminal; and
  a fifth current source circuit coupled between the one terminal of the current path of the second transistor and the second power supply terminal.

According to a second aspect of the present invention, an amplifier comprises:
  first and second power supply terminals
  first and second input terminals
  an output terminal
  a first current source circuit
  a transistor differential pair coupled to the first and second input terminal and coupled to the first power supply terminal through the first current source circuit;
  a first transistor a control terminal of which is coupled to the first input terminal, and one terminal of the current path of which is coupled to a first output of the transistor differential pair;
  a second transistor a control terminal of which is coupled to the second input terminal, one terminal of a current path of which is coupled to a second output of the transistor differential pair, and the other terminal of the current path of which is coupled to the output terminal;

a second current source circuit coupled between the one terminal of the current path of the first transistor and the second power supply terminal;

a third current source circuit coupled between the one terminal of the current path of the second transistor and the second power supply terminal; and a current mirror circuit connected between the first power supply terminal and the other terminals of the current paths of the first and second transistors, and operating as an active load and a converting circuit for converting a differential signal to a single signal.

According to the present invention, the amplifier operates stably without the phase margin being affected even if the load capacitance is changed. Accordingly, the restrictions of the operational condition of the conventional operational amplifier can be eliminated. Therefore, applications of the operational amplifiers can be increased. Since the same operational amplifier can be used even if the load capacitance varies, the number a design modifications can be decreased, compared to the conventional operational amplifier in which the optimal design must be tailored to each load capacitance.

Further, according to the present invention, the phase margin can be secured even if the load capacitance becomes smaller, so that the operational amplifier can operate stably. Accordingly, the operational amplifier of the present invention can be readily applied to an analog macro cell, for example.

DETAILED DESCRIPTION OF THE PREFERRED EMBODIMENTS

Figure 1:
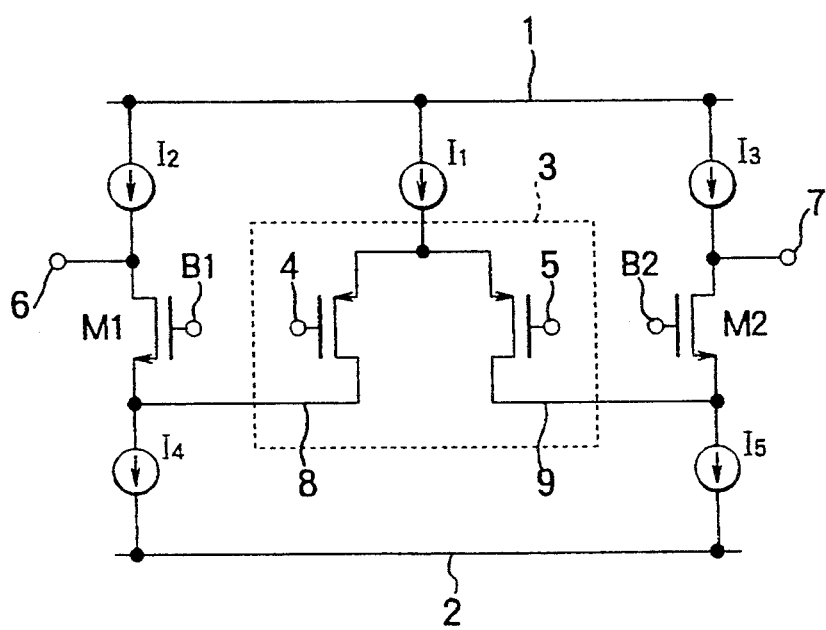
FIG. 1 is a circuit diagram showing a conventional folded cascoded operational amplifier.
Figure 2:
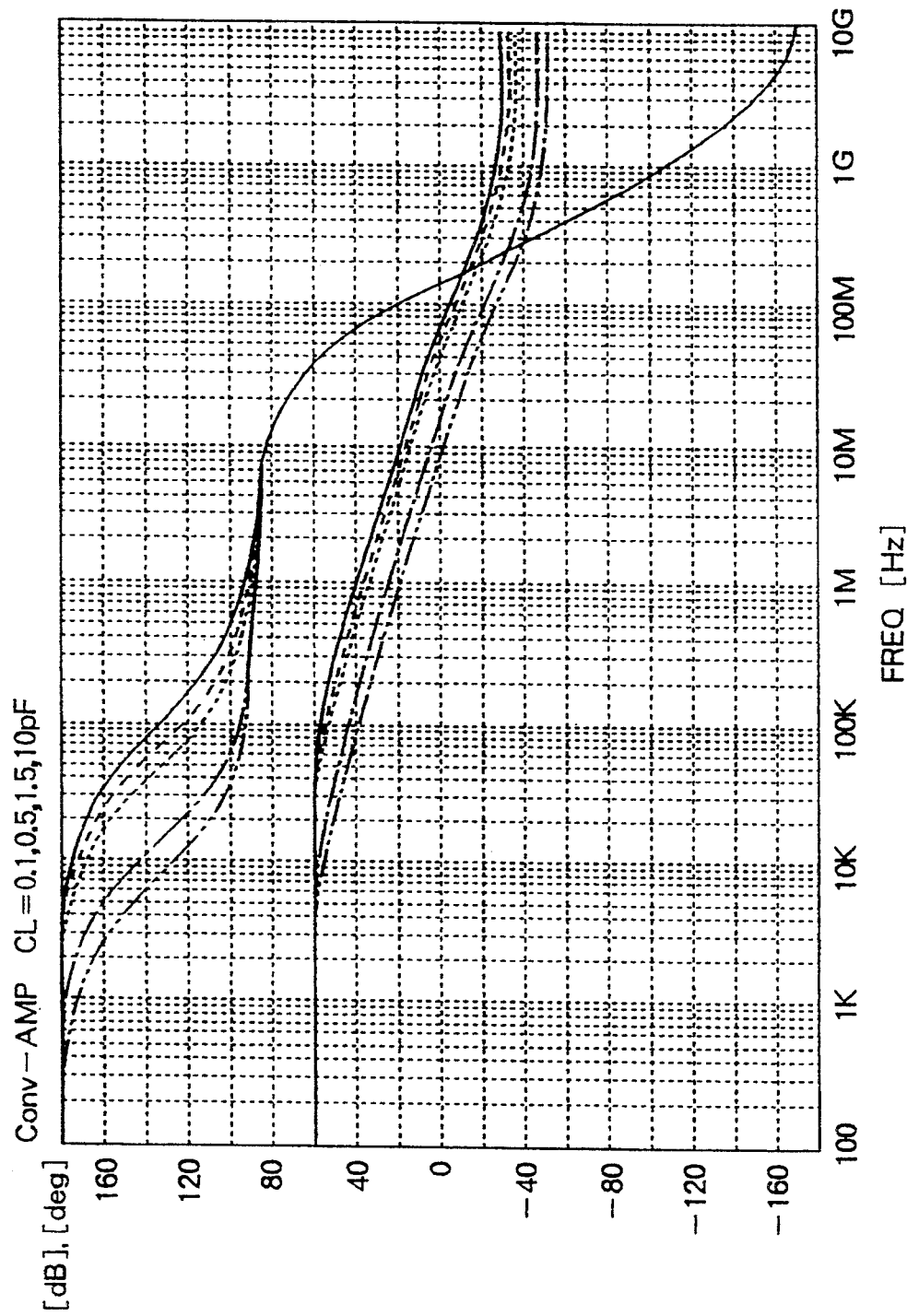
FIG. 2 is a chart illustrating a simulated result of a frequency characteristic of the operational amplifier shown in FIG. 1.

An embodiment of the OP amp according to the present invention will now be described with reference to FIG. 3.

The operational amplifier includes a transistor differential pair 3, a common source terminal of which is coupled to a first power supply terminal 1 through a first current source circuit I1. A first transistor M1 has a gate (control terminal) which is coupled to a first input terminal 4 of the transistor differential pair 3, a source (one terminal of a current path) which is coupled to a first output 8 of the transistor differential pair 3, and a drain (the other terminal of the current path) which is coupled to a first output terminal 6. A second current source circuit I2 is coupled between the first power supply terminal 1 and the drain of the first transistor M1. A second transistor M2 has a gate which is coupled to a second input terminal 5 of the transistor differential pair 3, a source which is coupled to a second output 9 of the transistor differential pair 3, and a drain which is coupled to a second output terminal 7. A third current source circuit I3 is coupled between the first power supply terminal and the drain of the second transistor M2. A fourth current source circuit I4 is coupled between the source of the first transistor M1 and the second power supply terminal 2. A fifth current source circuit I5 is coupled between the source of the second transistor M2 and the second power supply terminal 2.

The differential pair 3 is constituted by a depletion type or enhancement type P-channel MOSFETs (PMOSFETs), and the first and second transistors M1 and M2 are constituted by depletion type or enhancement type N-channel MOSFETs (NMOSFETs).

Figure 3:
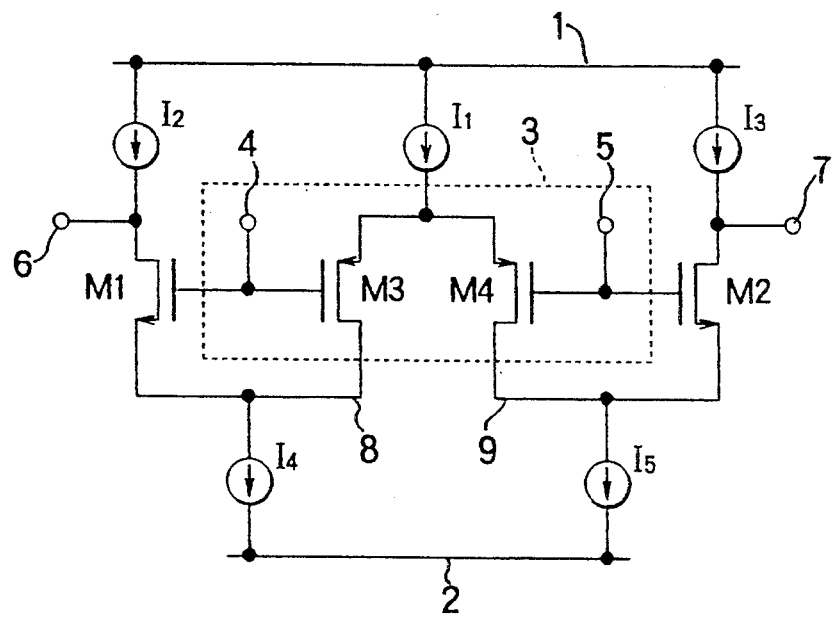
FIG. 3 is a circuit diagram of an operational amplifier of a first embodiment of the present invention.

The operational amplifier shown in FIG. 3 is an operational amplifier with differential input and output where a signal path from an input terminal 4 to an output terminal 6 and a signal path from an input terminal 5 to an output terminal 7 are constituted symmetrically.

A signal applied to the input terminal 4 is inverted by the third transistor M3 constituting the differential pair 3, amplified by the first transistor M1 and is then output from the output terminal 6. The signal applied to the input terminal 4 is also applied to the gate of the first transistor M1, inverted and amplified by the first transistor M1, superposed on a signal supplied through the first third transistor M3 and the first transistor M1, and then output from the output terminal 6.

A signal applied to an input terminal 5 is inverted by a fourth transistor M4 constituting the differential pair 3, amplified by the transistor M2, and is then output from the output terminal 7. The signal applied to the input terminal 4 is also applied to the gate of the second transistor M2, inverted and amplified by the second transistor M2, superposed on a signal supplied through the fourth transistor M4 and the second transistor M2, and is then output from the output terminal 7.

In the entire operational amplifier, the differential voltage applied between the input terminals 4 and 5 is inverted and amplified and is then output as the differential voltage between the output terminals 6 and 7. Since the operational amplifier shown in FIG. 3 has differential input and output, a common-mode voltage feedback circuit may be required in order to keep the common-mode voltage constant between the output terminals 6 and 7. However, such circuit does not shown in FIG. 3 since it is not relate to of the present invention.

The current: source circuit can simply be implemented by using transistors the gates of which are biased with a constant voltage.

Figure 4:
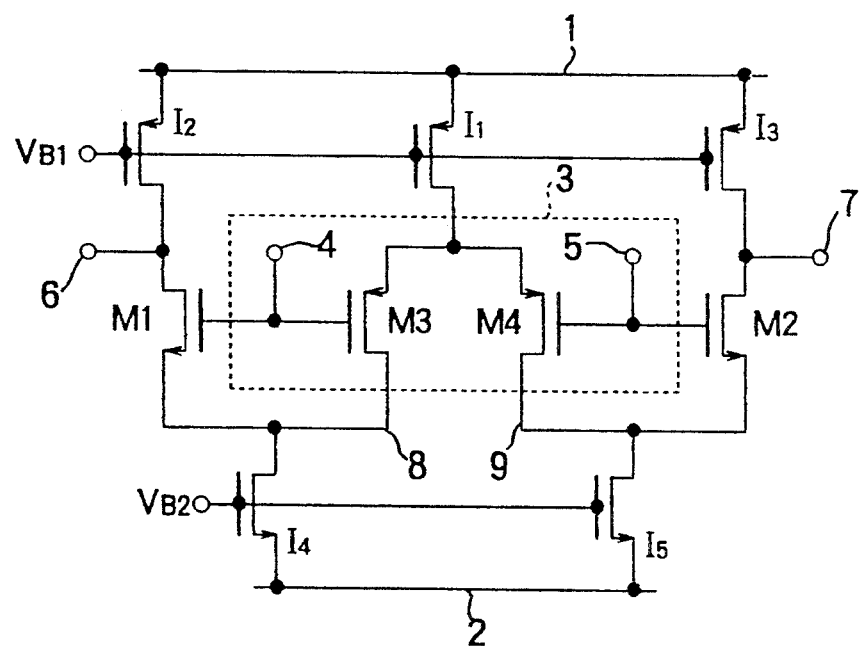
FIG. 4 is block diagram of a circuit diagram with a current source circuit of the operational amplifier of FIG. 3 constituted by transistors.

FIG. 4 shows an implementation where the current source circuit of the amplifier shown in FIG. 3 is constituted by transistors. In FIG. 4, first through third current source transistors I1, I2, and I3 are biased to a first bias voltage VB1, and fourth and fifth current source transistors I4 and I5 are biased to a second bias voltage VB2. The constant current source circuit is not limited to the example shown in FIG. 4.

As is apparent from the comparison of the operational amplifier shown in FIG. 3 of the present application and the conventional operational amplifier shown in FIG. 1, the inventive important of the present invention resides in that input signals are directly input from input terminals 4 and 5 to the gates of the gate-ground type transistors M1 and M2, respectively, which have been biased to a constant voltage in a conventional folded cascoded operational amplifier.

Due to this, a zero is generated at the high frequency to constrain the phase rotation of the signal in the OP amp. As a result, the frequency characteristic can be improved remarkably. It can be considered that this zero is generated by a signal path from the input terminal 4 (input terminal 5) to the output terminal 6 (output terminal 7) through the transistor M1 (transistor M2) serving as a feedforward signal with respect to a signal path from the transistor M3 (transistor M4) constituting the differential pair 3 to the output terminal 6 (output terminal 7) through the first transistor M1 (second transistor M2).

Figure 5:
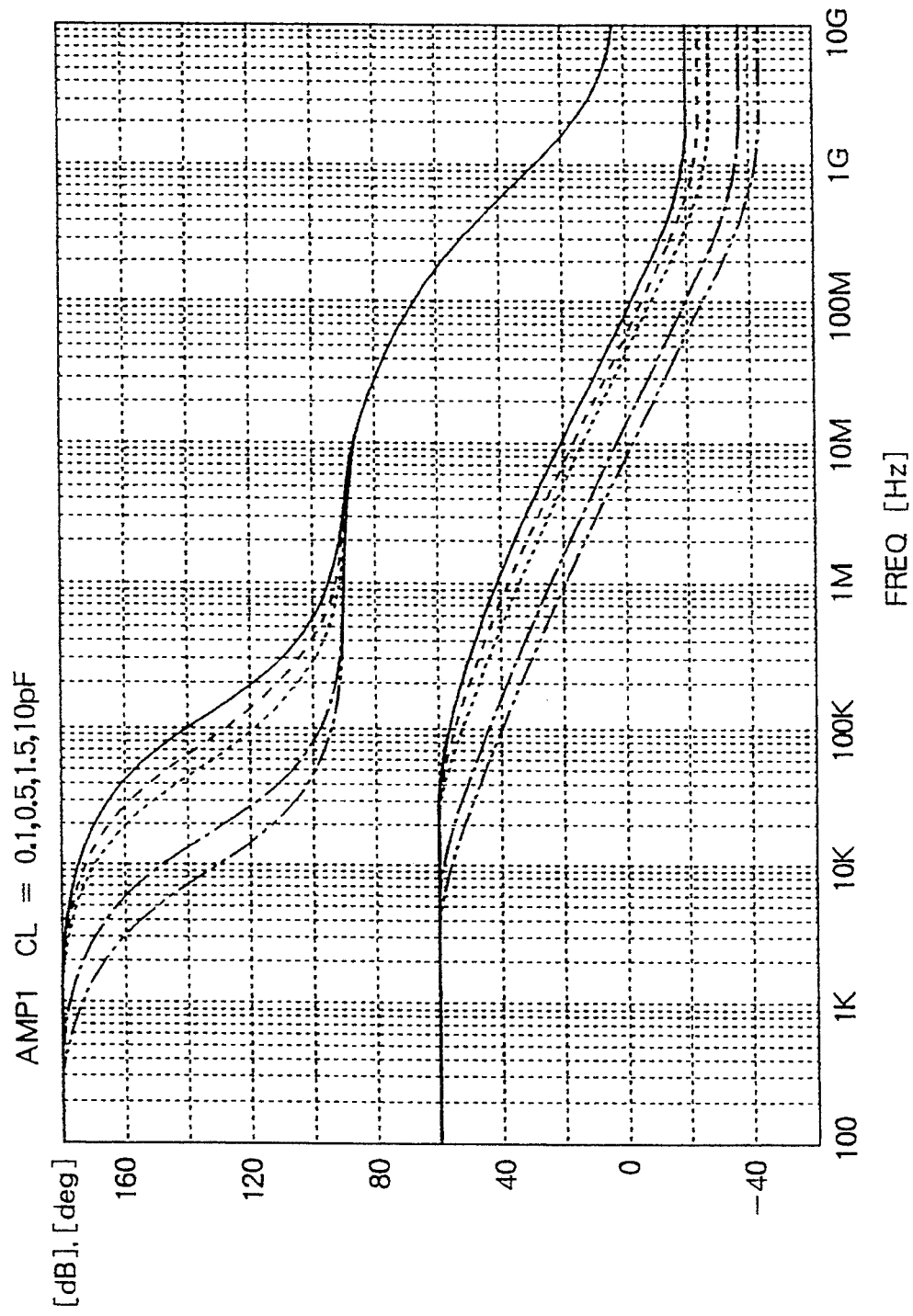
FIG. 5 is a chart illustrating a simulated result of a frequency characteristic of the operational amplifier shown in FIG. 3.

FIG. 5 illustrates a simulated result of the frequency characteristic of the circuit shown in FIG. 4. Similar to the simulation of the conventional circuit shown in FIG. 1, the waveforms are simulated by changing the load capacitances coupled to the output terminal 6 (output terminal 7) of the operational amplifier to such values as 10 pF, 5 pF, 1 pF, 0.5 pF and 0.1 pF. Furthermore, in order to facilitate the comparison with the conventional circuit, the simulation is performed by making the transistor size of the operational amplifier according to the present invention identical to that of the conventional circuit.

AS the load capacitance decreases, the unity gain frequency increases to such values as 7 MHz, 14 MHz, 45 MHz, 63 MHz, and 89 MHz. At this time, the phase margin slightly decreases to such values as 88 degrees, 86 degrees, 78 degrees, 74 degrees, and 69 degrees, but does not decrease remarkably as in the conventional circuit. More specifically, when the load is reduced, the phase margin in the conventional circuit becomes such a small value as the stable operation cannot be guaranteed. However, the operational amplifier of the present invention can operate stably since the phase margin is 69 degrees even when the load capacitance is 0.1 pF.

According to the applicant's experiment, the values of the unity frequency and the phase margin due to the change of the load capacitance in the operational amplifier according to the present invention and the conventional operational amplifier are as follows:

| load capacitance(pF) | 10 | 5 | 1 | 0.5 | 0.1 |
| --- | --- | --- | --- | --- | --- |
| conventional circuit | | | | | |
| Unity Gain Frequency (MHz) | 7 | 14 | 45 | 60 | 79 |
| Phase Margin (degree) | 85 | 79 | 56 | 46 | 34 |
| Present Invention | | | | | |
| Unity Gain Frequency (MHz) | 7 | 14 | 45 | 63 | 89 |
| Phase | 88 | 86 | 78 | 74 | 69 |
| load capacitance(pF) | 10 | 5 | 1 | 0.5 | 0.1 |
| Margin (degree) | | | | | |

As has been described above, according to the present invention, an operational amplifier can be provided which would operate stably even when the load capacitance is changed. This reveals that the restrictions of the operational conditions of the conventional operational amplifier can be eliminated, the application fields of the operation amplifier can be expanded, and the same operational amplifier can be used even in an application where the load capacitance is changed. Accordingly, the number of design modifications can be reduced compared to those of the conventional circuit where the optimal design should to be tailored to each load capacitance.

Figure 6:
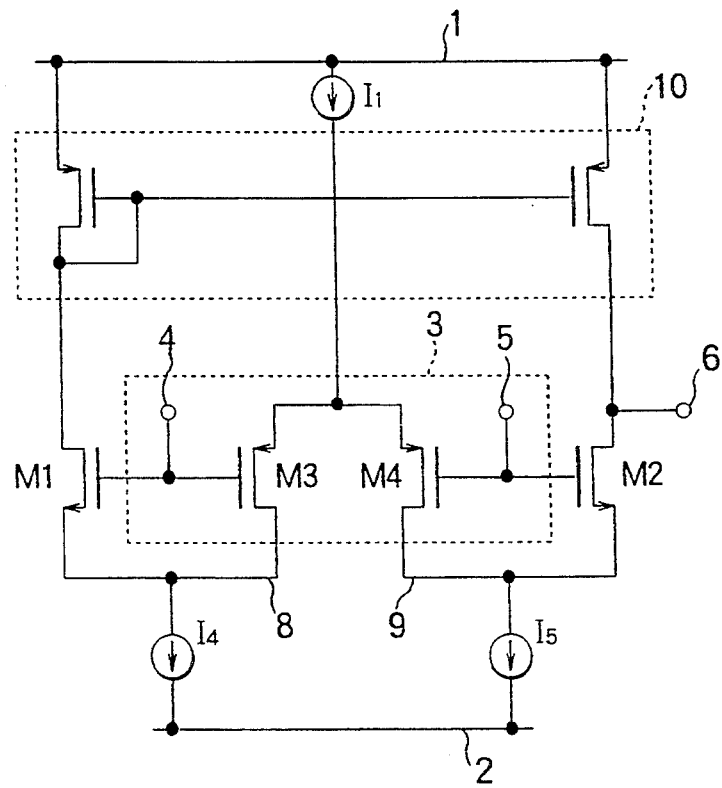
FIG. 6 is a circuit diagram of an operational amplifier in a second embodiment of the present invention.

A second embodiment of the operational amplifier according to the present invention is shown in FIG. 6.

An operational amplifier comprise a transistor differential pair 3, a common source terminal of which is coupled to a first power supply terminal 1 through a first current source circuit I1, a first transistor M1, a gate of which is coupled to a first input terminal 4 of the transistor differential pair 3, and a source of which is coupled to a first output 8 of the transistor differential pair 3 and a second transistor M2, a gate of which is coupled to a second input terminal 5 of the transistor differential pair 3, a source of which is coupled to a second output 9 of the transistor differential pair 3, and a drain of which is coupled to an output terminal 6. A second current source circuit I4 is coupled between the source of the first transistor M1 and the second power supply terminal. A third current source circuit I5 is coupled between the source of the second transistor M2 and the second power supply terminal 2. A current mirror circuit 10 is connected between the first power supply terminal 1 and drains of the first and second transistors M1 and M2, serving as an active load and a converting circuit for converting a differential signal to a single signal.

The operational amplifier circuit shown in FIG. 6 is a differential-input single-end-output operational amplifier in which a current mirror circuit 10 is provided as an active load circuit of the transistor M1 and M2, and which converts the differential input into the single end output. The current mirror circuit 10 is not limited to the one shown in FIG. 6 but various current mirror circuits can be applied such as the current mirror circuit in which transistors are cascade connected.

Figure 7:
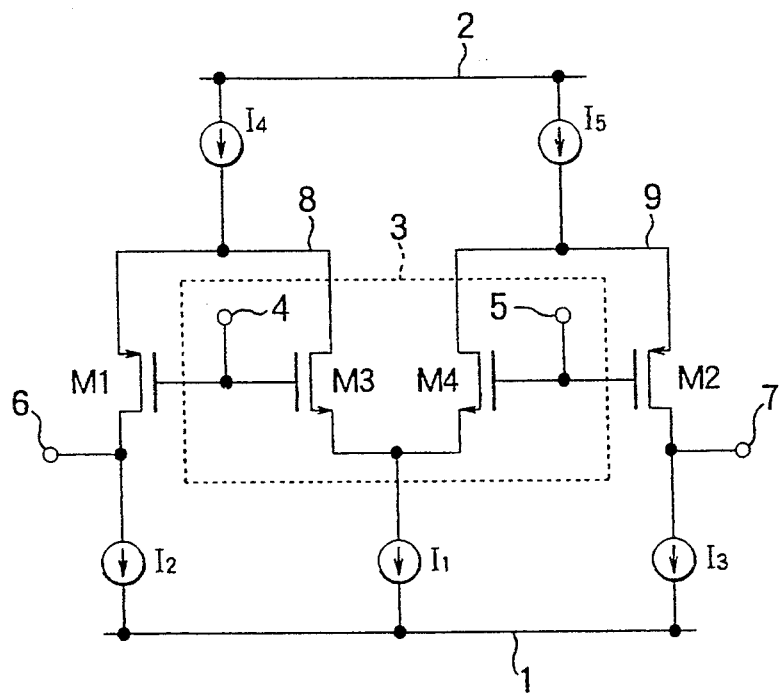
FIG. 7 is a circuit diagram of an operational amplifier of a third embodiment of the present invention.

In the embodiment shown in FIG. 3, the operational amplifier using the differential pair constituted by the PMOSFET has been described but not limited to the above embodiment. An operational amplifier shown in FIG. 7 in which the PMOSFETs are replaced with the NMOSFETs can also achieve the same effect as that of the circuit shown in FIG. 3. More specifically, according to the embodiment shown in FIG. 7, the third and fourth transistors constituting the differential pair 3 are constituted by the NMOSFETs, and the first and the second transistors M1 and M2 are constituted by the PMOSFETs.

In the embodiments, the operational amplifiers using the MOSFETs have been described. However the present invention is not limited to the operational amplifiers using the MOSFETs. Bipolar transistors may be used in place of the MOSFETs.

Figure 8:
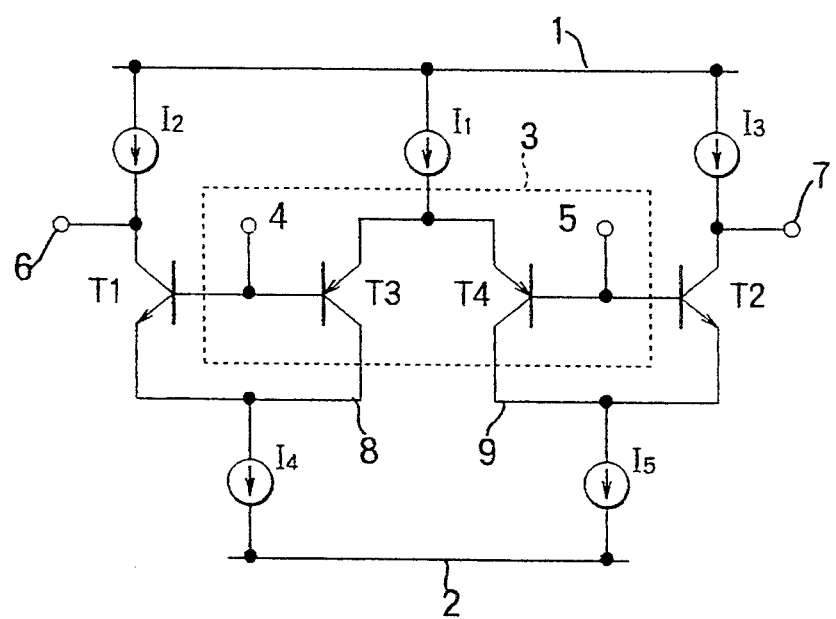
FIG.8 is a circuit diagram of an operational amplifier of a fourth embodiment of the present invention in which the operational amplifier is constituted by bipolar transistors.

The operational amplifiers in which the MOSFETs are replaced with bipolar transistors is shown in FIG. 8. In this embodiment, the first and second transistors T1 and T2 are constituted by NPN transistors and the third and fourth transistors T3 and T4 constituting the differential pair 3 are constituted by the PNP transistors. The third and fourth transistors T3 and T4 constituting the differential pair 3 may be constituted by the NPN transistors and the first and second transistors T1 and T2 may be constituted by the PNP transistors.

What is claimed is:

1. An operational amplifier comprising:
    a first power supply terminal and a second power supply terminal;
    a first input terminal and a second input terminal;
    a first output terminal and a second output terminal;
    a first current source circuit;
    a second current source circuit;
    a third current source circuit;
    said first, second, and third current source circuits being connected to the first power supply terminal;
    a transistor differential pair connected to the first and second input terminals and coupled to the first power supply terminal through the first current source circuit;
    a first transistor having a control terminal which is coupled to the first input terminal, one terminal of a current path which is coupled to a first output of the transistor differential pair, and another terminal of the current path which is coupled to the first output terminal and the first power source terminal through the second current source circuit;
    a second transistor having a control terminal which is coupled to the second input terminal, one terminal of a current path which is coupled to a second output of the transistor differential pair, and another terminal of the current path which is coupled to the second output terminal and the first power source terminal through the third current source circuit;
    a fourth current source circuit coupled between the one terminal of the current path of the first transistor and the second power supply terminal; and
    a fifth current source circuit coupled between the one terminal of the current path of the second transistor and the second power supply terminal.

2. The operational amplifier according to claim 1, wherein the transistor differential pair is constituted by P-channel MOSFETs and the first and second transistors are constituted by N-channel MOSFETs.

3. The operational amplifier according to claim 1, wherein the transistor differential pair is constituted by N-channel MOSFETs and the first and second transistors are constituted by P-channel MOSFETs.

4. The operational amplifier according to claim 1, wherein the transistor differential pair and the first and second transistors are constituted by bipolar transistors.

5. An operational amplifier comprising:
    a first power supply terminal and a second power supply terminal;
    a first input terminal and a second input terminal;
    an output terminal;
    a first current source circuit;
    a transistor differential pair coupled to the first input terminal and the second input terminal and coupled to the first power supply terminal through the first current source circuit;
    a first transistor having a control terminal which is coupled to the first input terminal, and one terminal of the current path which is coupled to a first output of the transistor differential pair;
    a second transistor having a control terminal which is coupled to the second input terminal, one terminal of a current path which is coupled to a second output of the transistor differential pair, and another terminal of the current path which is coupled to the output terminal;
    a second current source circuit coupled between the one terminal of the current path of the first transistor and the second power supply terminal;
    a third current source circuit coupled between the one terminal of the current path of the second transistor and the second power supply terminal; and
    a current mirror circuit connected between the first power supply terminal and said another terminals of the current paths of the first and second transistors, and operating as an active load and a converting circuit for converting a differential signal to a single signal.

6. The operational amplifier according to claim 5, wherein the transistor differential pair is constituted by P-channel MOSFETs and the first and second transistors are constituted by N-channel MOSFETs.

7. The operational amplifier according to claim 5, wherein the transistor differential pair is constituted by N-channel MOSFETs and the first and second transistors are constituted by P-channel MOSFETs.

* * * * *